US006987147B2

(12) United States Patent
Lau et al.

(10) Patent No.: US 6,987,147 B2
(45) Date of Patent: Jan. 17, 2006

(54) LOW DIELECTRIC CONSTANT MATERIALS WITH IMPROVED THERMO-MECHANICAL STRENGTH AND PROCESSABILITY

(75) Inventors: Kreisler Lau, Sunnyvale, CA (US); Bo Li, Campbell, CA (US); Boris Korolev, San Jose, CA (US); Edward Sullivan, Daly City, CA (US); Ruslan Zherebin, Daly City, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/263,204

(22) Filed: Oct. 1, 2002

(65) Prior Publication Data

US 2003/0162002 A1 Aug. 28, 2003

Related U.S. Application Data

(60) Provisional application No. 60/326,570, filed on Oct. 1, 2001.

(51) Int. Cl.
*C08G 65/30* (2006.01)
*C08G 65/38* (2006.01)
*C08F 8/00* (2006.01)

(52) U.S. Cl. .................. 525/132; 525/149; 525/152; 525/534; 528/86; 528/125; 528/185; 528/219; 528/220

(58) Field of Classification Search ............... 525/132, 525/149, 152, 534; 528/86, 125, 185, 219, 528/220
See application file for complete search history.

(56) References Cited

U.S. PATENT DOCUMENTS

2002/0022708 A1 * 2/2002 Lau et al. ................... 528/86

OTHER PUBLICATIONS

Polym, Prepr. (Am. Chem. Soc., Div. Polym. Chem.), 1993, vol. 34 (1), pp. 495–496.
Polym, Prepr. (Am. Chem. Soc., Div. Polym. Chem.), 1992, vol. 33 (2), pp. 144–145.
Chem. Mater., 1993, vol. 5 (1), pp. 4–5; Macromolecules, 1994, vol. 27 (24), pp. 7030–7034.
Macromolecules, 1994, vol. 27 (24), pp. 7015–7023.
Polym, Prepr. (Am. Chem. Soc., Div. Polym. Chem.), 1995, vol. 36 (1), pp. 741–742.
$205^{th}$ ACS National Meeting, Conference Program, 1993, pp. 312.
Macromolecules, 1994, vol. 27 (24), pp. 7024–7029.
Macromolecules, 1992, vol. 25 (9), pp. 2294–2306.
Macromolecules, 1991, vol. 24, (18), pp. 5232–5233.
Veronica R. Reichert, PhD Dissertation, 1994, vol. 55–06B.
ACS Symp. Ser.: Step–Growth Polymers for High–Performance Materials, 1996, vol. 624, pp. 197–207.
Macromolecules, 2000, vol. 33 (10), pp. 3855–3859.
Polym, Prepr. (Am. Chem. Soc., Div. Polym. Chem.), 1999, vol. 40 (2), pp. 620–621.
Polym, Prepr. (Am. Chem. Soc., Div. Polym. Chem.), 1999, vol. 40 (2), pp. 577–578.
Macromolecules, 1997, vol. 30 (19), pp. 5970–5975.
J. Polym. Sci, Part A: Polymer Chemistry, 1997, vol. 35 (9), pp. 1743–1751.
Polym, Prepr. (Am. Chem. Soc., Div. Polym. Chem.), 1996, vol. 37 (2), pp. 243–244.
Polym, Prepr. (Am. Chem. Soc., Div. Polym. Chem.), 1996, vol. 37 (1), pp. 551–552.
J. Polym. Sci., Part A: Polymer Chemistry, 1996, vol. 34 (3), pp. 397–402.
Polym, Prepr. (Am. Chem. Soc., Div. Polym. Chem.), 1995, vol. 36 (2), pp. 140–141.
Polym, Prepr. (Am. Chem. Soc., Div. Polym. Chem.), 1992, vol. 33 (2), pp. 146–147.
J. Appl. Polym. Sci., 1998, vol. 68 (3), pp. 475–482).

* cited by examiner

*Primary Examiner*—James J. Seidleck
*Assistant Examiner*—Olga Asinovsky
(74) *Attorney, Agent, or Firm*—Bingham McCutchen; Sandra P. Thompson

(57) ABSTRACT

A polymeric network comprises a plurality of monomers that include a cage compound with at least three arms, wherein at least one of the arms has two or more branches, and wherein each of the branches further comprises a reactive group. Monomers in contemplated polymeric networks are covalently coupled to each other via the reactive groups. Particularly contemplated cage compounds include adamantane and diamantane, and especially contemplated branched arms comprise ortho-bis(phenylethynyl)phenyl. Especially contemplated polymeric networks have a dielectric constant of no more than 3.0, and are formed on the surface of a substrate.

34 Claims, 4 Drawing Sheets

R:

R": H or OH

LOW DIELECTRIC CONSTANT MATERIALS WITH IMPROVED THERMO-MECHANICAL STRENGTH AND PROCESSABILITY

This application claims priority to U.S. Provisional Application Ser. No. 60/326,570 filed on Oct. 1, 2001.

FIELD OF THE INVENTION

The field of the invention is low dielectric constant materials.

BACKGROUND

As interconnectivity in integrated circuits increases and the size of functional elements decreases, the dielectric constant of insulator materials embedding the metallic conductor lines in integrated circuits becomes an increasingly important factor influencing the performance of the integrated circuit. Insulator materials having low dielectric constants (i.e., below 3.0) are especially desirable, because they typically allow faster signal propagation, reduce capacitive effects and cross talk between conductor lines, and lower voltages to drive integrated circuits.

Since air has a dielectric constant of 1.0, a major goal is to reduce the dielectric constant of insulator materials down to a theoretical limit of 1.0, and several methods are known in the art for reducing the dielectric constant of insulating materials. These techniques include adding elements such as fluorine to the composition to reduce the dielectric constant of the bulk material. Other methods to reduce k include use of alternative dielectric material matrices.

Therefore, as interconnect linewidths decrease, concomitant decreases in the dielectric constant of the insulating material are required to achieve the improved performance and speed desired of future semiconductor devices. For example, devices having interconnect linewidths of 0.13 or 0.10 micron and below seek an insulating material having a dielectric constant (k)<3.

Currently silicon dioxide ($SiO_2$) and modified versions of $SiO_2$, such as fluorinated silicon dioxide or fluorinated silicon glass (hereinafter FSG) are used. These oxides, which have a dielectric constant ranging from about 3.5–4.0, are commonly used as the dielectric in semiconductor devices. While $SiO_2$ and FSG have the mechanical and thermal stability needed to withstand the thermal cycling and processing steps of semiconductor device manufacturing, materials having a lower dielectric constant are desired in the industry.

Methods used to deposit dielectric materials may be divided into two categories: spin-on deposition (hereinafter SOD) and chemical vapor deposition (hereinafter CVD). Several efforts to develop lower dielectric constant materials include altering the chemical composition (organic, inorganic, blend of organic/inorganic) or changing the dielectric matrix (porous, non-porous). Table I summarizes the development of several materials having dielectric constants ranging from 2.0 to 3.5. (PE=plasma enhanced; HDP= high-density plasma) However, these dielectric materials and matrices disclosed in the literature, patent applications or patents shown in Table 1 fail to exhibit many of the combined physical and chemical properties desirable and even necessary for efficient dielectric materials, such as mechanical stability, thermal stability, high glass transition temperature, or appropriate hardness, while at the same time still being able to be solvated and spun on to a substrate, wafer or other surface. Therefore, it may be useful to investigate other compounds and materials that may be useful as dielectric materials and layers, even though these compounds or materials may not be currently contemplated as dielectric materials in their present form.

TABLE I

| MATERIAL | DEPOSITION METHOD | K | REFERENCE |
| --- | --- | --- | --- |
| Fluorinated silicon oxide (SiOF) | PE-CVD; HDP-CVD | 3.3–3.5 | U.S. Pat. No. 6,278,174 |
| Hydrogen Silsesquioxane (hereinafter HSQ) | SOD | 2.0–2.5 | U.S. Pat. Nos. 4,756,977; 5,370,903; and 5,486,564; International Patent Publication WO 00/40637; E.S. Moyer et al., "Ultra Low k Silsesquioxane Based Resins", Concepts and Needs for Low Dielectric Constant <0.15 μm Interconnect Materials: Now and the Next Millennium, Sponsored by the American Chemical Society, pages 128–146 (Nov. 4–17, 1999) |
| Methyl Silsesquioxane (hereinafter MSQ) | SOD | 2.4–2.7 | U.S. Pat. No. 6,143,855 |
| Polyorganosilicon | SOD | 2.5–2.6 | U.S. Pat. No. 6,225,238 |
| Fluorinated Amorphous Carbon (a-C:F) | HDP-CVD | 2.3 | U.S. Pat. No. 5,900,290 |
| Benzocyclobutene (hereinafter BCB) | SOD | 2.4–2.7 | U.S. Pat. No. 5,225,586 |
| Polyarylene Ether (hereinafter PAE) | SOD | 2.4 | U.S. Pat. Nos. 5,986,045, 5,874,516, and 5,658,994 |
| Parylene (N and F) | CVD | 2.4 (AF4) | U.S. Pat. No. 5,268,202 |

TABLE I-continued

| MATERIAL | DEPOSITION METHOD | K | REFERENCE |
| --- | --- | --- | --- |
| Polyphenylenes | SOD | 2.6 | U.S. Pat. Nos. 5,965,679 and 6,288,188B1; and Waeterloos et al., "Integration Feasibility of Porous SiLK Semiconductor Dielectric". Proc. Of the 2001 International Interconnect Tech. Conf., pp. 253–254 (2001). |

Reichert and Mathias describe compounds and monomers that comprise adamantane molecules, which are in the class of cage-based molecules and are taught to be useful as diamond substitutes. (Polym, Prepr. (Am. Chem. Soc., Div. Polym. Chem.), 1993, Vol. 34 (1), pp. 495–6; Polym, Prepr. (Am. Chem. Soc., Div. Polym. Chem.), 1992, Vol. 33 (2), pp. 144–5; Chem. Mater., 1993, Vol.5 (1), pp. 4–5; Macromolecules, 1994, Vol. 27 (24), pp. 7030–7034; Macromolecules, 1994, Vol. 27 (24), pp. 7015–7023; Polym, Prepr. (Am. Chem. Soc., Div. Polym. Chem.), 1995, Vol. 36 (1), pp. 741–742; 205$^{th}$ ACS National Meeting, Conference Program, 1993, pp. 312; Macromolecules, 1994, Vol. 27 (24), pp. 7024–9; Macromolecules, 1992, Vol. 25 (9), pp. 2294–306; Macromolecules, 1991, Vol. 24 (18), pp. 5232–3; Veronica R. Reichert, PhD Dissertation, 1994, Vol. 55-06B; ACS Symp. Ser.: Step-Growth Polymers for High-Performance Materials, 1996, Vol. 624, pp. 197–207; Macromolecules, 2000, Vol. 33 (10), pp. 3855–3859; Polym, Prepr. (Am. Chem. Soc., Div. Polym. Chem.), 1999, Vol. 40 (2), pp. 620–621; Polym, Prepr. (Am. Chem. Soc., Div. Polym. Chem.), 1999, Vol. 40 (2), pp. 577–78; Macromolecules, 1997, Vol. 30 (19), pp. 5970–5975; J. Polym. Sci, Part A: Polymer Chemistry, 1997, Vol. 35 (9), pp. 1743–1751; Polym, Prepr. (Am. Chem. Soc., Div. Polym. Chem.), 1996, Vol. 37 (2), pp. 243–244; Polym, Prepr. (Am. Chem. Soc., Div. Polym. Chem.), 1996, Vol. 37 (1), pp. 551–552; J. Polym. Sci., Part A: Polymer Chemistry, 1996, Vol. 34 (3), pp. 397–402; Polym, Prepr. (Am. Chem. Soc., Div. Polym. Chem.), 1995, Vol. 36 (2), pp. 140–141; Polym, Prepr. (Am. Chem. Soc., Div. Polym. Chem.), 1992, Vol. 33 (2), pp. 146–147; J. Appl. Polym. Sci., 1998, Vol. 68 (3), pp. 475–482). The adamantane-based compounds and monomers described by Reichert and Mathias are preferably used to form polymers with adamantane molecules at the core of a thermoset. The compounds disclosed by Reichert and Mathias in their studies, however, comprise only one isomer of the adamantane-based compound by design choice. Structure A shows this symmetrical para isomer 1,3,5,7-tetrakis(4-phenylethynylphenyl)adamantane:

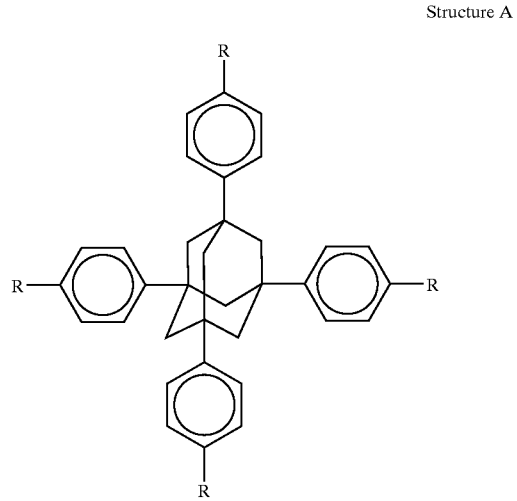

Structure A

In other words, Reichert and Mathias in their individual and joint work contemplate a useful polymer comprising only one isomer form of the target adamantane-based monomer. A significant problem exists, however, when forming polymers with the single isomer form (symmetrical "all-para" isomer) 1,3,5,7-tetrakis[(4'-phenylethynyl)phenyl] adamantane of the adamantane-based monomer. According to the Reichert dissertation (supra) and Macromolecules, vol. 27, (pp. 7015–7034) (supra), the symmetrical all-para isomer 1,3,5,7-tetrakis[(4'-phenylethynyl)phenyl] adamantane "was found to be soluble enough in chloroform that a $^1$H NMR spectrum could be obtained. However, acquisition times were found to be impractical for obtaining a solution $^{13}$C NMR spectrum." Thus, the Reichert symmetrical "all-para" isomer 1,3,5,7-tetrakis[(4'-phenylethynyl)phenyl]adamantane would not be useful in any application requiring solubility or solvent-based processing, such as flow coating, spin coating, or dip coating.

Although various methods are known in the art to lower the dielectric constant of a material, all, or almost all of them have disadvantages. Thus, there is still a need in the semiconductor industry to a) provide improved compositions and methods to lower the dielectric constant of dielectric layers; b) provide dielectric materials with improved mechanical properties, such as thermal stability, glass transition temperature ($T_g$) and hardness; and c) produce thermosetting compounds and dielectric materials that are capable of being solvated and spun-on to a wafer or layered material.

SUMMARY OF THE INVENTION

The subject matter herein is directed to compositions and methods of producing polymeric networks with improved thermo-mechanical stability and processability. Contemplated networks comprise a plurality of monomers, wherein at least one of the monomers comprises a cage compound with at least three arms, wherein at least one of the at least three arms has two or more branches, and wherein each of the branches comprises a reactive group. Contemplated monomers are covalently coupled to each other in a polymeric network via the reactive group. In some contemplated embodiments, each of the monomers comprises a cage compound with at least three arms, wherein at least one of the at least three arms has two or more branches, and wherein each of the branches comprises a reactive group.

It is generally contemplated that the polymeric networks described herein have a low dielectric constant, and more contemplated polymeric networks have a dielectric constant of no more than 3.0, and preferably between 2.3 and 2.7.

In one aspect of the inventive subject matter, the cage compound comprises adamantane or diamantane, and the arms in contemplated monomers preferably comprise a phenyl. It is also contemplated that the branches comprise a substituted or unsubstituted phenylethynyl, and it is further contemplated that the arms (including the branches) have a total length L, and that the dielectric constant of the polymeric network decreases when L increases.

In another aspect of the inventive subject matter, preferred monomers are thermosetting monomers and particularly include substituted and unsubstituted 1,3,5,7-Tetrakis[ortho-bis(phenylethynyl)phenyl]adamantane, 1,3,5,7-Tetrakis[meta-bis(phenylethynyl)phenyl]adamantane, 1,3,5,7-Tetrakis[para-bis(phenylethynyl)phenyl]adamantane, 1,3,5,7-Tetrakis[ortho-bis(phenylethynyl)phenyl]diamantane, 1,3,5,7-Tetrakis[meta-bis(phenylethynyl)phenyl]diamantane, and 1,3,5,7-Tetrakis[para-bis(phenylethynyl)phenyl]diamantane. While it is generally contemplated that the particular chemical nature of the reactive group is not limiting to the inventive subject matter, it is generally preferred that the reactive group comprises a triple bond. It is further contemplated that where the reactive group comprises a triple bond, covalent coupling of two monomers occurs without addition of an exogenous crosslinker.

In a still further aspect of the inventive subject matter, a method of producing an electronic device has one step in which a substrate, such as a silicon wafer, is provided. In another step, contemplated polymeric networks are formed and/or applied on or to the surface of the silicon wafer. It is generally preferred that contemplated monomers are dissolved in a solvent to form a spin-on solution, and that the spin-on solution is subsequently applied to the surface. Contemplated methods may further include thermal activation of the reactive groups to effect the coupling of the monomers, and a curing step to advance the glass transition temperature (Tg).

In yet another aspect of the inventive subject matter, the contemplated polymeric networks may be used to form a film, a layer, such as an etchstop or hardmask layer, an electronic device or semiconductor device, a multilayered material or article or a porous material and/or layer.

Various objects, features, aspects and advantages of the present invention will become more apparent from the following detailed description of preferred embodiments of the invention, along with the accompanying drawing.

DETAILED DESCRIPTION

Figure 1:
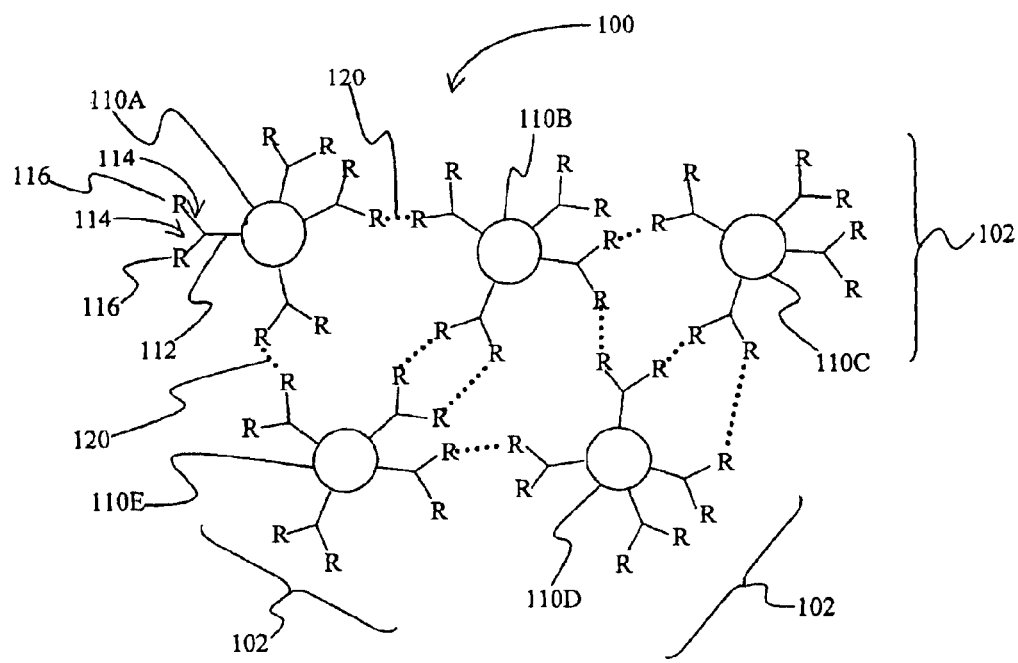
FIG. 1 is a schematic of a contemplated polymeric network.

As used herein, the term "low dielectric constant polymer" refers to an organic, organometallic, or inorganic polymer with a dielectric constant of approximately 3.0 or lower. As also used herein, the term "backbone" refers to a contiguous chain of atoms or moieties forming a polymeric strand that are covalently bound such that removal of any of the atoms or moiety would result in interruption of the chain.

As used herein, the term "monomer" generally refers to a recurring building block in a polymeric composition, wherein the composition may exclusively consist of the recurring building block (e.g., a homopolymer), or wherein the composition may comprise components other than the recurring building block (e.g., a heteropolymer). Consequently, the term "polymeric network" refers to a composition in which a plurality of monomers are covalently coupled to each other, wherein the coupling may or may not include additional crosslinkers, which may optionally comprise functional elements. The term "building block" as used herein refers to a structural constituent that gives the polymer a particular set of physico-chemical properties. In contrast, additives (including crosslinkers, softeners, and flow enhancers) are not considered building blocks since they are not structural constituents.

As further used herein, the term "reactive group" refers to any atom, functionality, or group having sufficient reactivity to form at least one covalent bond with another reactive group in a chemical reaction. The chemical reaction may take place between two identical, or non-identical reactive groups, which may be located on the same or on two separate backbones. It is also contemplated that the reactive groups may react with one or more than one secondary or exogenous crosslinking molecules to crosslink the first and second backbones. Although crosslinking without exogenous crosslinkers presents various advantages, including reducing the overall number of reactive groups in the polymer, and reducing the number of required reaction steps, crosslinking without exogenous crosslinkers has also a few detriments. For example, the amount of crosslinking functionalities can typically be no more adjusted. On the other hand, employing exogenous crosslinkers may be advantageous when the polymerization reaction and crosslinking reaction are chemically incompatible.

As still further used herein, the phrases "cage structure", "cage molecule", and "cage compound" are intended to be used interchangeably and refer to a molecule having at least eight atoms arranged such that at least one bridge covalently connects two or more atoms of a ring system. In other words, a cage structure, cage molecule or cage compound comprises a plurality of rings formed by covalently bound atoms, wherein the structure, molecule or compound defines a volume, such that a point located within the volume cannot leave the volume without passing through the ring. The bridge and/or the ring system may comprise one or more heteroatoms, and may contain aromatic, partially saturated, or unsaturated groups. Further contemplated cage structures include fullerenes, and crown ethers having at least one bridge. For example, an adamantane or diamantane is considered a cage structure, while a naphthalene or an aromatic spirocompound are not considered a cage structure under the scope of this definition, because a naphthalene or an aromatic spirocompound do not have one, or more than one bridge.

As still further used herein, the term "arm" refers to any atom or molecule that covalently couples at least two branches to the cage compound. For example, a single atom (e.g., a carbon or nitrogen atom) or phenyl ring is considered an arm under the scope of this definition, since at least two branches may be coupled to the single atom or phenyl ring, when the single atom or phenyl ring are covalently bound to a cage compound. In contrast, a covalent bond is not considered an arm, because a covalent bond is not an atom or molecule. The term "branch" as used herein refers to any molecule that is (1) covalently bound to the arm, (2) that comprises at least three atoms, and (3) that further includes at least one reactive group. For example, an ethynyl or a phenylethynyl group covalently bound to an arm is considered a branch under the scope of this definition, because both the ethynyl and phenylethynyl group comprise at least three atoms, are covalently bound to the arm, and include a reactive group. In contrast, an isopentyl group is not a branch, because an isopentyl group does not include a reactive group.

A contemplated polymeric network is shown in FIG. 1, in which a polymeric network 100 comprises a plurality of monomers 102. Each of the monomers 102 comprises a cage compound 110A–110E. Coupled to the cage compound are arms 112 with branches 114. Each of the branches 114 comprises a reactive group 116. The polymeric network 100 is formed from the monomers 102 by covalent bonds 120 coupling the reactive groups 116 of the respective branches 114. In other contemplated embodiments, at least one of the monomers 102 comprises a cage compound.

In a contemplated embodiment, the polymeric network is formed from tetrakis[meta-bis(phenylethynyl)phenyl] adamantane, having an adamantane as a cage compound and four identical arms, wherein each of the arms consists of a phenyl group. Each arm further has two identical branches (here: phenylethynyl), in which the reactive group is a triple bond. The polymeric network is formed from the monomers by thermal activation of the triple bonds in the branches, wherein one carbon atom in a triple bond of one monomer forms in a cycloaddition reaction a covalent bond with another carbon atom in a triple bond of another monomer. Thus, it should be especially appreciated that by providing at least two reactive groups in two branches on one arm, thermo-mechanical stability is significantly increased. While not wishing to be bound by a particular mechanism or theory, it is contemplated that, among other factors, the increase in thermo-mechanical stability is attributable to a reduction in rotational degree of freedom of the arms and to covalent bonds connecting a single arm to at least two other monomers via the two reactive groups in the two branches on the single arm.

Figure 3A:
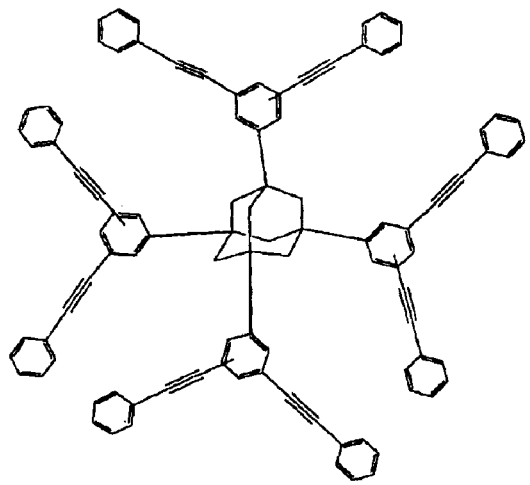
FIGS. 3A–3C show structures of contemplated monomers for the synthesis of polymeric networks.
Figure 3B:
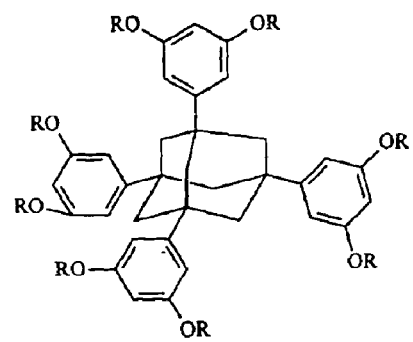
Figure 3B:
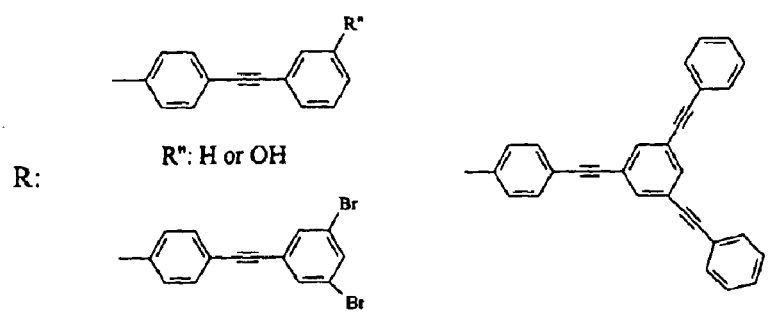
Figure 4:
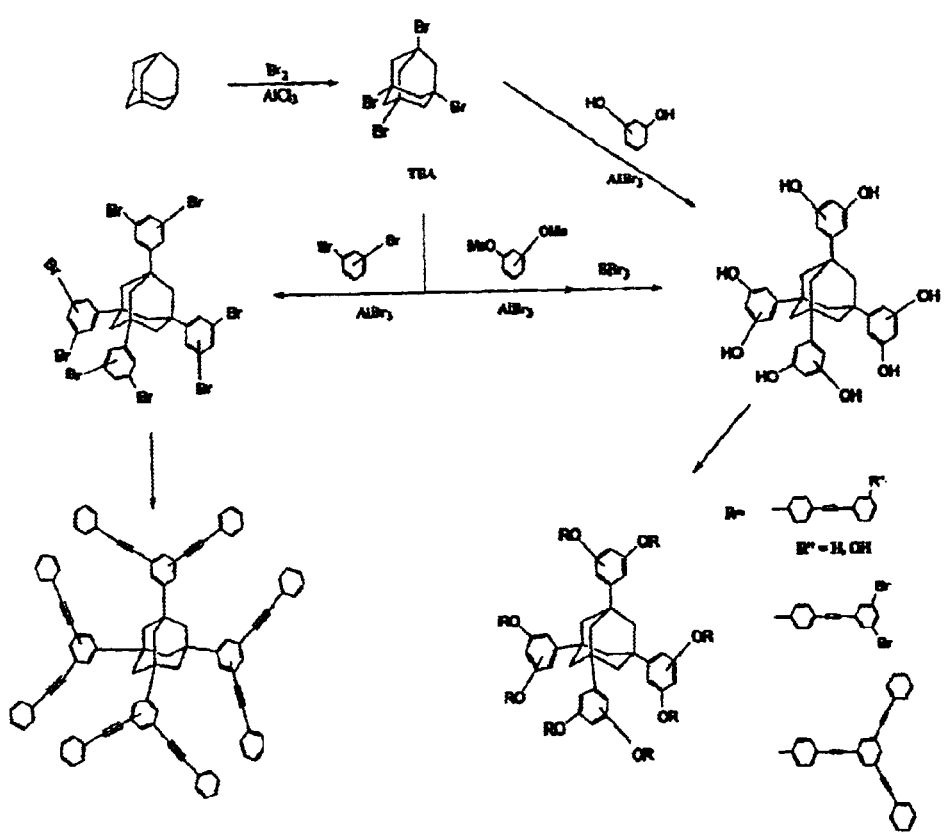
FIG. 4 is a synthetic scheme of contemplated monomers.

Some of the contemplated monomers are shown in FIGS. 3A–3B and a synthetic strategy for some contemplated monomers is shown in FIG. 4. Referring to FIG. 4, commercially available adamantane is brominated to yield tetrabromoadamantane (TBA) following a procedure previously described (*J. Org. Chem.* 45, 5405–5408 (1980) by Sollot, G. P. and Gilbert, E. E.). TBA is reacted with phenyl-1,3-dibromide to yield tetrakis(meta-dibromophenyl)adamantane (TBPA) under conditions similar to those described in *Macromolecules*, 27, 7015–7022 (1990) by Reichert, V. R, and Mathias L. J. TBPA is subsequently reacted with ethynylphenyl in a palladium catalyzed Heck reaction following standard reaction procedures to yield tetrakis[meta-bis(phenylethynyl)phenyl] adamantane. Alternatively, TBA (supra) can be converted to tetrakis[meta-dihydroxyphenol]adamantane, which is subsequently transformed into contemplated monomers in a nucleophilic aromatic substitution reaction with the corresponding activated fluoroaromatic compounds in the presence of potassium carbonate employing standard procedures (e.g., Engineering Plastics—A Handbook of Polyarylethers by R. J. Cotter, Gordon and Breach Publishers, ISBN 2-88449-112-0). It should be understood that although FIG. 4 shows a meta version of the monomers that both ortho and para versions of the monomers can be readily prepared by one of ordinary skill in the art by using a similar synthetic scheme to that presented in FIG. 4.

Figure 3C:
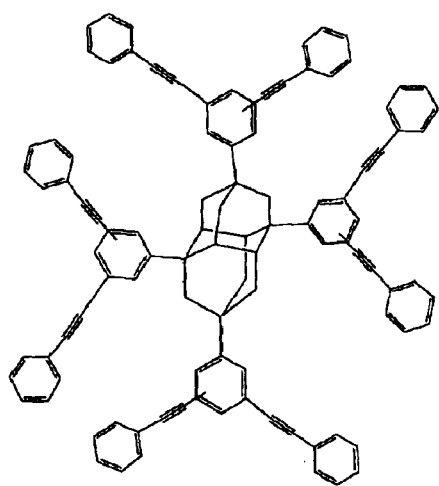

Although one contemplated cage compound is adamantane, various cage compounds other than adamantane are also contemplated, and especially include substituted adamantane and substituted and unsubstituted diamantane. An alternate generic structure of contemplated monomers with diamantane as the cage compound is depicted in FIG. 3C. It should be especially appreciated that the molecular size and configuration of the cage compound in combination with the overall length of the arms and branches will determine the size of voids in the final low dielectric constant polymeric network (e.g., by steric effect). Therefore, where relatively small cage compounds are desirable, substituted and derivatized adamantanes, diamantanes, and relatively small, bridged cyclic aliphatic and aromatic compounds (with typically less than 15 atoms) are contemplated. In contrast, in cases where larger cage compounds are desirable, larger bridged cyclic aliphatic and aromatic compounds (with typically more than 15 atoms) and fullerenes are contemplated.

It should further be appreciated that contemplated cage compounds need not necessarily be limited to carbon atoms, but may also include heteroatoms such as N, S, O, P, etc. Heteroatoms may advantageously introduce non-tetragonal bond angle configurations, which may in turn enable covalent attachment of arms (and consequently branches) at various bond angles. With respect to substitutents and derivatizations of contemplated cage compounds, it should be recognized that many substituents and derivatizations are appropriate. For example, where the cage compounds are relatively hydrophobic, hydrophilic substituents may be introduced to increase solubility in hydrophilic solvents, or vice versa. Alternatively, in cases where polarity is desired, polar side groups may be added to the cage compound. It is further contemplated that appropriate substituents may also include thermolabile groups, nucleophilic and electrophilic groups. It should also be appreciated that functional groups maybe employed in the cage compound (e.g., to facilitate crosslinking reactions, derivatization reactions, etc.) Where the cage compounds are derivatized, it is especially contemplated that derivatizations include halogenation of the cage compound, and a particularly preferred halogen is fluorine (e.g., to reduce oxidative damage) and bromine (e.g., to impart flame retardancy).

The cage compound may also be replaced by a ring-containing compound, preferably with six or more atoms (typically carbon atoms). Contemplated alternative ring-containing compounds especially include substituted and unsubstituted aryls (e.g., benzene, phenyl, naphthalene). However, numerous ring-containing compounds are also contemplated, including crown ethers, macrocyclic hydrocarbons, and ring-of-ring structures (e.g., a cyclic poly(arylene ether)).

The cage compound may also be replaced by an on-carbon atom with a polygonal, more preferably tetragonal configuration. Contemplated atoms include a silicon atom, and particularly contemplated atoms include atoms that exhibit polygonal ligand configuration and form covalent bonds with a resistance to oxidation greater than a carbon-carbon bond. Furthermore, alternative atoms may also include cationic and anionic species of a particular atom. For example, appropriate atoms are germanium and phosphorus.

With respect to the arms, it is generally contemplated that suitable arms (1) comprise at least one atom (more preferably at least 2, 3, 4, or 5 atoms), and (2) are covalently bound to both the cage compound and at least two branches. However, it is generally preferred that contemplated arms comprise an aryl having at least six carbon atoms (e.g., a phenyl), and it is even more preferred that the aryl is a phenyl group. In alternative aspects, it is contemplated that various aryl compounds other than a phenyl group are also appropriate, including substituted and unsubstituted bi- and polycyclic aromatic compounds. For example, substituted and unsubstituted bi- and polycyclic aromatic compounds are particularly advantageous, where increased arm length of the thermosetting monomer is preferred. On the other hand, where it is desirable that some of the arms extend in one dimension more than in another dimension, it is contemplated that some of the arms may comprise naphthalene, phenanthrene, or anthracene. In still other cases, where it is desirable that the arms are particularly space consuming, polycyclic aryls such as a coronene are contemplated. In especially preferred aspects, contemplated bi- and polycyclic aryls have conjugated aromatic systems that may or may not include heteroatoms. With respect to substitutions and derivatizations of contemplated aryls, the same considerations apply as for cage compounds (vide supra).

In further alternative aspects, contemplated arms may have numerous configurations other than comprising one or more aryls, and it should be appreciated that the chemical nature and/or configuration of contemplated arms is not limiting to the inventive subject matter. Thus, suitable arms may be relatively short with no more than one or two atoms (which may or may not be carbon atoms). Short arms may be especially advantageous where the size of voids incorporated into the final low dielectric constant polymer need to be relatively small. In contrast, where especially long arms are preferred, the arms may comprise an oligomer or polymer with 6–40, and more atoms. Alternatively, and especially where space demanding arms are required, contemplated arms may be branched. Furthermore, the length as well as the chemical composition of the arms may vary within one monomer. For example, a cage compound may have two relatively short arms and two relatively long arms to promote dimensional growth in a particular direction during polymerization. In another example, a cage compound may have two arms chemically distinct from another two arms to promote regioselective derivatization reactions.

It is generally preferred that contemplated arms form a backbone, and particularly preferred arms have a backbone comprising at least one phenyl group which may or may not be conjugated with an aromatic system in at least one arm. As used herein, the term "backbone" refers to a contiguous chain of atoms or moieties forming a strand that are covalently bound such that removal of any of the atoms or moiety would result in interruption of the chain.

With respect to the number of arms in a monomer it is contemplated that suitable monomers have at least three arms to promote three-dimensional polymerization. However, it should be appreciated that number of arms on a monomer will also depend on a particular cage compound. For example, where the cage compound has an adamantane or diamantane structure, four arms are preferred. On the other hand, where the cage compound is relatively large, (e.g., a fullerene), five to ten, or more arms are also considered appropriate.

Contemplated arms may further comprise a reactive group, and it is generally preferred that such arms comprise an aryl, a branched aryl, or an arylene ether. Particularly contemplated aryls comprising a triple bond as reactive group include aryls having a tolanyl, a phenylethynylphenylethynylphenyl, a tolanyl, or a p-tolanylphenyl moiety. Particularly contemplated arylene ethers include p-tolanylphenyl ether.

With respect to the branches it is contemplated that suitable branches are (1) coupled to at least one arm via a covalent bond, and (2) comprise at least one reactive group. With respect to the chemical nature and configuration of the branches, the same consideration as described for the arms apply (supra). It is further preferred that contemplated branches form a backbone, and particularly preferred branches have a backbone comprising at least one phenyl group and one reactive group.

Contemplated reactive groups in the branches include electrophilic and nucleophilic groups, more preferably groups that may participate in a cyclo-addition reaction and an especially preferred reactive group is an ethynyl group. It is further preferred that reactive groups are capable of forming a covalent bond with another reactive group without addition of an exogenous crosslinking agent. However, in alternative aspects, it is also contemplated that the reactive group may form a covalent bond with a crosslinking agent in a reaction that may or may not involve a catalyst. Such reactive groups may include polar groups, anhydrides, activated acids and bases, etc. Contemplated crosslinking agents generally include bifunctional molecules, and particularly bifunctional aryls.

While it is generally contemplated that each branch has at least one reactive group, and that all branches in one monomer have identical reactive groups, it should also be appreciated that the number and chemical nature of the reactive group in a branch may vary substantially. For example, where the branches are relatively long, contemplated branches may include two to five, and more identical reactive groups. On the other hand, where the reactive groups form a covalent bond in a Diels-Alder-type reaction, one branch in the monomer may include a diene as a reactive group while another branch in the same monomer may include a dienophile as a reactive group. In still further alternative aspects, contemplated monomers may have reactive groups on less than all of the branches, so long as contemplated monomers have at least one arm with two branches, wherein each of the two branches have one reactive group.

Moreover, reactive groups are contemplated to be positioned in any part of the branch, including the backbone, side chain or terminus of a branch. It should further be especially appreciated that the number of reactive groups in the monomer may be employed as a tool to control the degree of crosslinking. For example, where a relatively low degree of crosslinking is desired, contemplated monomers may have only one or two reactive groups. On the other hand, where a relatively high degree of crosslinking is required, three or more reactive groups may be included into the monomer.

Contemplated monomers can be incorporated into the polymeric network by a large variety of mechanisms, and the actual mechanism of incorporation predominantly depends on the reactive group that participates in the incorporation. Therefore, contemplated mechanisms include nucleophilic, electrophilic and aromatic substitutions, additions, eliminations, radical polymerizations, and cycloadditions, and a particularly preferred incorporation is a cycloaddition that involves at least one ethynyl group located in at least one of the branches. For example, where a plurality of monomers has branches that include a triple bond as the reactive group, the incorporation of the monomer into the polymeric network may comprise a cycloaddition reaction (i.e. a chemical reaction) among the triple bonds. In other examples, cycloadditions (e.g., a Diels-Alder reaction) may occur between an ethynyl group in a branch of a monomer and a diene group located on another monomer or polymer. It is particularly preferred that the incorporation of contemplated monomers into a polymeric network takes place without participation of an additional molecule (e.g., a crosslinker), preferably as a cycloaddition reaction between reactive groups of contemplated monomers. However, in alternative aspects of the inventive subject matter, crosslinkers may be employed to covalently couple a monomer to the polymeric network or other monomer. Depending on the mechanism of incorporation of the thermosetting monomer into the polymer, reaction conditions may vary considerably. For example, where a monomer is incorporated by a cycloaddition employing a triple bond of at least one of the branches, thermal activation of the monomer to approximately 250° C. for about 45 min is generally sufficient. In contrast, where the monomer is incorporated into a polymer by a radical reaction, room temperature and addition of a radical starter may be appropriate.

It should be especially appreciated that (1) the size of the cage compound and (2) the overall length of the arms and branches will determine nanoporosity, if any is present, imparted by a steric effect. Consequently, it should be appreciated that extending the length of at least one of the arms and branches, or increasing the volume of the cage compound will results in increased nanoporosity, and therefore in a decreased dielectric constant. Thus, the volume of the cage compound and particularly the overall length of the arms and branches in a monomer can be employed to fine tune or regulate the dielectric constant of a low dielectric constant polymer harboring the thermosetting monomer. It is especially contemplated that by extension of the arms in a thermosetting monomer the dielectric constant may be reduced in an amount of up to 0.2, preferably of up to 0.3, more preferably of up to 0.4 and most preferably of up to 0.5 dielectric constant units.

Therefore, a method of producing an electronic device may have one step in which a substrate is provided, and a further step in which a polymeric network is formed and/or applied on or to the surface of the substrate, and wherein the polymeric network is formed from contemplated monomers. With respect to the monomers, the same considerations as discussed above apply. It is preferred that the monomers are polymerized to a polymeric network by thermal activation, and that the polymeric network is further cured to advance the glass transition temperature of the polymeric network. Contemplated polymeric networks generally have a dielectric constant of no more than 3.0, and polymeric networks formed from monomers disclosed herein have a dielectric constant in the range of between about 2.3 and 2.7, and even less, such as 2.5. It is further contemplated that suitable polymeric networks may comprise additional voids.

The contemplated polymeric networks may also be used to form a film, a layer, such as an etchstop or hardmask layer, an electronic device or semiconductor device, a layered material, article or component or a porous material and/or layer.

The monomers, monomer mixtures and polymers described herein can be and in many ways are designed to be solvated or dissolved in any suitable solvent, so long as the resulting solutions can be spin coated or otherwise mechanically layered on to a substrate, a wafer or layered material. There are numerous methods of spin-coating a dielectric substrate known in the art, and all of the known methods are considered appropriate. Substrates contemplated herein may comprise any desirable substantially solid material. Particularly desirable substrate layers would comprise films, glass, ceramic, plastic, metal or coated metal, or composite material. In preferred embodiments, the substrate comprises a silicon or gallium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers. In more preferred embodiments, the substrate comprises a material common in the packaging and circuit board industries such as silicon, copper, glass, and polymers.

Preferred solutions are designed and contemplated to be spin coated, rolled, dripped or sprayed onto a wafer, a substrate or layered material. Most preferred solutions are designed to be spin coated onto a wafer, a substrate or layered material. Typical solvents are those solvents that are readily available to those in the field of dielectric materials, layered components or electronic components.

Typical solvents are also those solvents that are able to solvate the monomers, isomeric monomer mixtures and polymers. Contemplated solvents include any suitable pure or mixture of organic, organometallic or inorganic molecules that are volatilized at a desired temperature. The solvent may also comprise any suitable pure or mixture of polar and non-polar compounds. In preferred embodiments, the solvent comprises water, ethanol, propanol, acetone, toluene, ethers, cyclohexanone, butyrolactone, methylethylketone, methylisobutylketone, N-methylpyrrolidone, polyethyleneglycolmethylether, mesitylene, and anisole.

After application of the present composition to an electronic topographical substrate, the coated structure is subjected to a bake and cure thermal process at increasing temperatures ranging from about 50° C. up to about 450° C. to polymerize the coating. The curing temperature is at least about 300° C. because a lower temperature is insufficient to complete the reaction herein. Generally, it is preferred that curing is carried out at temperatures of from about 375° C. to about 425° C. Curing maybe carried out in a conventional curing chamber such as an electric furnace, hot plate, and the like and is generally performed in an inert (non-oxidizing) atmosphere (nitrogen) in the curing chamber. In addition to furnace or hot plate curing, the present compositions may also be cured by exposure to ultraviolet radiation, microwave radiation, or electron beam radiation as taught by commonly assigned patent publication PCT/US96/08678 and U.S. Pat. Nos. 6,042,994; 6,080,526; 6,177,143; and 6,235,353, which are incorporated herein by reference in their entireties. Any non oxidizing or reducing atmospheres (e.g., argon, helium, hydrogen, and nitrogen processing gases) may be used in the practice of the present invention, if they are effective to conduct curing of the present adhesion promoter-modified thermosetting component (a) to achieve the low k dielectric layer herein.

The present films may be used in dual damascene (such as copper) processing and substractive metal (such as aluminum or aluminum/tungsten) processing for integrated circuit manufacturing. The present compositions may be used as an etch stop, hardmask, air bridge, or passive coating for enveloping a completed wafer. The present composition may be used in a desirable all spin-on stacked film as taught by Michael E. Thomas, "Spin-On Stacked Films for Low $k_{eff}$ Dielectrics", Solid State Technology (July 2001), incorporated herein in its entirety by reference. The present layers maybe used in stacks with other layers comprising organosiloxanes such as taught by commonly assigned U.S. Pat. No. 6,143,855 and pending U.S. Ser. No. 10/078919 filed Feb. 19, 2002; Honeywell International Inc.'s commercially available HOSP® product; nanoporous silica such as taught by commonly assigned U.S. Pat. No. 6,372,666; Honeywell International Inc.'s commercially available NANO-GLASS® E product; organosilsesquioxanes taught by commonly assigned WO 01/29052; and fluorosilsesquioxanes taught by commonly assigned U.S. Pat. No. 6,440,550, incorporated herein in their entirety.

Figure 2:
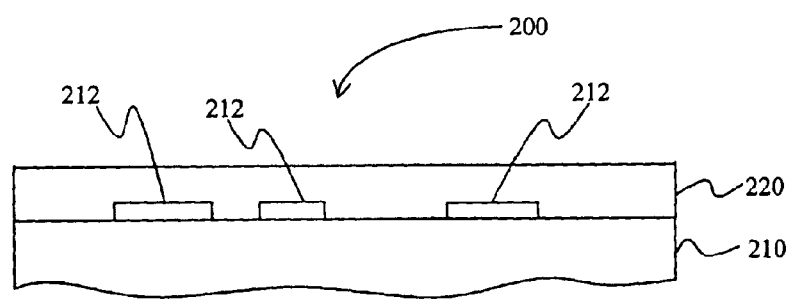
FIG. 2 is a horizontal cross section of a contemplated electronic device incorporating a polymeric network.

An exemplary electronic device is shown in FIG. 2, in which the device 200 comprises a silicon wafer 210 with a plurality of conductive traces 212. Disposed onto the surface of the silicon wafer is the polymeric network 220.

EXAMPLES

Analytical Test Methods:

Dielectric Constant: The dielectric constant was determined by coating a thin film of aluminum on the cured layer and then doing a capacitance-voltage measurement at 1 MHz and calculating the k value based on the layer thickness.

Glass Transition Temperature (Tg): The glass transition temperature of a thin film is determined by measuring the thin film stress as a function of temperature. The thin film stress measurement is performed on a KLA 3220 Flexus. Before the film measurement, the uncoated wafer is annealed at 500° C. for 60 min to avoid any errors due to stress relaxation in the wafer itself. The wafer is then deposited with the material to be tested and processed through all required process steps. The wafer is then placed in the stress gauge, which measures the wafer bow as function of temperature. The instrument can calculate the stress versus temperature graph, provided that the wafer thickness and the film thickness are known. The result is displayed in graphic form. To determine the Tg value, a horizontal tangent line is drawn (a slope value of zero on the stress vs. temperature graph). Tg value is where the graph and the horizontal tangent line intersect.

It should be reported if the Tg was determined after the first temperature cycle or a subsequent cycle where the maximum temperature was used, the measurement process itself may influence Tg.

Shrinkage: Film shrinkage is measured by determining the film thickness before and after the process. Shrinkage is expressed in percent of the original film thickness. Shrinkage is positive if the film thickness decreased. The actual thickness measurements are performed optically using a J. A. Woollam M-88 spectroscopic ellipsometer. A Cauchy model is used to calculate the best fit for Psi and Delta (details on Ellipsometry can be found in e.g. "Spectroscopic Ellipsometry and Reflectometry" by H. G. Thompkins and William A. McGahan).

Refractive Index: The refractive index measurements are performed together with the thickness measurements using a J. A. Woollam M-88 spectroscopic ellipsometer. A Cauchy model is used to calculate the best fit for Psi and Delta. Unless noted otherwise the refractive index is reported at a wavelength of 633 nm (details on Ellipsometry can be found in e.g. "Spectroscopic Ellipsometry and Reflectometry" by H. G. Thompkins and William A. McGahan).

Synthesis of 1,3,5,7-Tetrabromoadamantane (TBA)

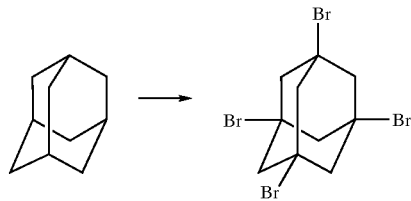

1,3,5,7-Tetrabromoadamantane synthesis started from commercially available adamantane and followed the synthetic procedures as described in G. P. Sollott and E. E. Gilbert, J. Org. Chem., 45, 5405–5408 (1980), B. Schartel, V. Stümpflin, J. Wendling, J. H. Wendorff, W. Heitz, and R. Neuhaus, Colloid Polym. Sci., 274, 911–919 (1996), or A. P. Khardin, I. A. Novakov, and S. S. Radchenko, Zh. Org. Chem., 9, 435 (1972). Quantities of up to 150 g per batch were routinely synthesized.

Synthesis of 1,3,5,7-Tetrakis(ortho-dibromophenyl) adamantane (TODBPA)

In a first step, TBA was reacted with 1,2-dibromobenzene to yield 1,3,5,7-tetrakis(ortho-dibromophenyl)adamantane (TODBPA) as generally described in Macromolecules, 27, 7015–7023 (1994) (supra).

Specifically, the Experimental Procedure for the above is as follows:

Equipment:
1. Dry 5 L 3-neck round bottom flask. 2. Water condenser. 3. Magnetic stir-bar. 4. Heating mantle. 5. Thermocouple. 6. Thermal controller unit. 7. $N_2$ inlet-outlet to 30% KOH solution. Assemble above equipment and Purge flask with $N_2$ for 10 min.

Procedure:
Weigh 160.00±0.30 g of TBA and 4,800.00±1.0 g of 1,2-dibromobenzene. Total volume is 3220 mL and d=1.49. Weigh 32.25±0.30 g of Aluminum Bromide. Pour 2 L (62% v/v from total volume) of 1,2-dibromobenzene into flask. Activate stir-bar.

Add full amount of TBA and rinse funnel with 1 L (31% v/v from total volume) of 1,2-dibromobenzene. Take HPLC sample of starting material. Compare with standard HPLC chromatogram.

Add full amount of aluminum bromide to solution and rinse funnel with 220 mL (7% v/v from total volume)

of 1,2-dibromobenzene. Solution at this point should be dark purple with no precipitation visible. Stir the reaction mixture for 1 h at room temperature.

After 1 h, raise temperature of reaction mixture to 40° C. After temperature reaches 40° C., stir reaction mixture for 3 hr. Take HPLC sample at time 1+3.0, respectively, at 40° C. Note: The reaction is judged to be over if no traces of TBA are seen on HPLC chromatogram.

When reaction is over, pour the dark reaction mixture into a 20 L pail containing 7 L (217% V/v relative to the total volume of 1,2-dibromobenzene) D.I. Water, 2 L (62% v/v relative to the total volume of 1,2-dibromobenzene) ice, and 300 mL (37%) HCl (9% v/v relative to the total volume of 1,2-dibromobenzene). Stir vigorously using an overhead-stirrer for 1 hr±10 min.

Transfer the organic layer to a separatory chamber and wash it 2 times with 700 mL (22% v/v relative to the total volume of 1,2-dibromobenzene) portions of de-ionized water. Place the washed organic layer in a 4 L separatory funnel and add it, as a slow stream, to 16 L (5× times to the total volume of 1,2-dibromobenzene) methanol, in a 30 L pail placed under and overhead-stirrer, to precipitate a solid during 25 min±5 min.

After addition is complete, agitate the methanol suspension vigorously during 1 hr±10 min. Filter the methanol suspension by suction through a Buchner funnel (185 mm). Wash the solid on filter cake with three portions of 600 mL (19% v/v relative to the total volume of 1,2-dibromobenzene) methanol. Let the solid suction dry for 30 min.

Empty the pinkish powder into a crystallizer dish using a spatula and place it in a vacuum-oven to dry overnight. Weigh after drying. Re-dry in the vacuum-oven for 2 additional hours and re-weight. Continue drying, if necessary, until weight change is <1%. After solid is dry, record the final weight and calculate yield. Expected Yield is 176.75–192.80 g (66–72%).

Unexpectedly, however, when the product mixture was subjected to fresh reagent and catalyst (1,2-dibromobenzene and AlCl$_3$, 1 min at 20° C.), TODBPA was obtained in yields of approximately 70%.

A subsequent Experimental Procedure for converting the above product to a more useful product is as follows:

Equipment:

1. Dry 5 L 3-neck round bottom flask. 2. Water condenser. 3. Magnetic stir-bar. 4. Heating mantle. 5. Thermocouple. 6. Thermal controller unit. 7. N$_2$ inlet-outlet to 30% KOH solution. Assemble above equipment and Purge flask with N$_2$ for 10 min.

Procedure:

Calculate the corresponding amounts of 1,2-dibromobenzene and aluminum bromide needed based on the yield of the TODBPA synthesized in the above/conventional synthesis.

Pour the appropriate amount (80% v/v from the total volume) of 1,2-dibromobenzene into flask. Activate stir-bar.

Add full amount of TODBPA from the previous synthesis and rinse funnel with appropriate amount (10% v/v from the total volume) of 1,2-dibromobenzene.

Take HPLC sample of starting material. Compare with standard HPLC chromatogram.

Add full amount of aluminum bromide to the solution and rinse funnel with remainder (10% from the total volume) of 1,2-dibromobenzene. Solution at this point should be dark purple with no precipitation visible.

Stir the reaction mixture for 17 min at room temperature. Take HPLC sample after 5 min. Take HPLC sample after 17 min.

Note: The reaction is judged to be over when the group of peaks corresponding to TODBPA is dominant in the HPLC chromatogram.

When reaction is over, pour the dark reaction mixture into a 20 L pail containing 7 L (217% v/v relative to the total volume of 1,2-dibromobenzene) D.I. Water, 2 L (62% v/v relative to the total volume of 1,2-dibromobenzene) ice, and 300 mL (37%) HCl (9% v/v relative to the total volume of 1,2-dibromobenzene).

Stir vigorously using an overhead-stirrer for 1 hr±10 min.

Transfer the organic layer to a separatory chamber and wash it 2 times with 700 mL (22% v/v to the total volume of 1,2-dibromobenzene) portions of D.I. water and 3 times with 700 mL (22% v/v relative to the total volume of 1,2-dibromobenzene) portions of saturated NaCl solution.

Place the washed organic layer in a 4 L separatory funnel and add it, as a slow stream, to the appropriate amount (5× times to the total volume of 1,2-dibromobenzene) methanol, in a 30 L pail placed under and overhead-stirrer, to precipitate a solid during 25 min±5 min.

After addition is complete, agitate the methanol suspension vigorously during 1 hr±10 min.

Filter the methanol suspension by suction through a Buchner funnel (185 mm).

Wash the solid on filter cake with three portions of 600 mL (19% v/v relative to the total amount of 1,2-dibromobenzene) methanol.

Let the solid suction dry for 30 min.

Empty the pinkish powder into a crystallizer dish using a spatula and place it in an oven to dry overnight. Weigh after drying. Re-dry in the vacuum-oven for 2 additional hours and re-weigh. Continue drying, if necessary, until weight change is <1%. After solid is dry, record the final weight and calculate yield.

Synthesis of 1,3,5,7-Tetrakis[ortho-bis (phenylethynyl)phenyl]adamantane (TOBPEPA)

TODBPA was reacted with phenylacetylene to yield the final product 1,3,5,7-tetrakis[(ortho-bis(phenylethynyl) phenyl)]adamantane (TOBPEPA)—as a mixture of isomers—following a general reaction protocol for a palladium-catalyzed Heck ethynylation. TOBPEPA made from the reaction including TODBPA is soluble in cyclohexanone. The yield is approximately 50%.

Specifically, the procedure for this step is as follows:

Equipment:

1. Dry 2 L 3-neck round bottom flask. 2. Water condenser. 3. Overhead-Stirrer. 4. Heating mantle. 5. Thermocouple. 6. Thermal controller unit. 7. Dropping funnel 8. 2-necked adapter. 9. N$_2$ inlet-outlet to 30% KOH solution. Assemble above equipment and Purge flask with N$_2$ for 10 min.

Procedure:

Weigh TODBPA from second synthesis procedure from above.

Calculate amount needed for each of the following compounds: a) Phenylacetylene; b) (Ph$_3$P)$_2$PdCl$_2$; c) Triphenylphosphine; d) Copper(I) Iodide; and e) Triethylamine.

Add the appropriate amount of Triethylamine (Total volume from 1-e minus 300 mL) to the reaction flask and activate the overhead stirrer, follow it by the addition of the following compounds in the order listed below:

(Ph$_3$P)$_2$PdCl$_2$, rinse the funnel with 50 mL (4% of total volume) of triethylamine (TEA) and stir for 5 min.

Triphenylphosphine, rinse the funnel with 50 mL (4% of total volume) TEA, stir for 5 min.

Copper(I) Iodide, rinse the funnel with 50 mL (4% of total volume) TEA, stir for 5 min.

Add the total amount of TODBPA from the second TODBPA synthesis above and rinse the funnel with 100 mL (8% of total volume) TEA. Start heating the flask to 80° C.

Place the measured quantity of phenylacetylene diluted with 50 mL (4% of total volume) TEA in the dropping funnel, mounted on one neck of the 2-necked adapter.

Once the temperature of the reaction mixture reaches 80° C., take a sample for HPLC analysis. This material is the starting material.

Add the diluted phenylacetylene dropwise to the reaction mixture over 30 min±10 min.

Note: This is an exothermic reaction. Control the temperature by using a water bath.

Continue heating for 3 hours. The reaction is stopped after 3 hours of heating at 80° C. Take an HPLC sample at time 3 hours at 80° C.

Cool the reaction mixture to 50° C. then filter through a Buchner funnel. (185 mm). Wash the crude solids 2 times with 600 mL of TEA. (v/v %=52% relative to 1-e)

Load filter cake to a 4 L beaker and stir the contents with 1 L (v/v %=87% relative to 1-e) of TEA for 15 min at room temperature.

Filter through a Buchner funnel (185 mm) and wash the crude solids 2 times with 300 mL TEA. (v/v %=26% relative to 1-e)

Suction dry the solids overnight.

Note: Take 3 g of crude product for (TLC, HPLC, DSC, Trace Metals, UV-VIS) analysis.

Synthesis of 1,3,5,7-Tetrakis(meta-dibromophenyl) adamantane (TMDBPA)

In a first step, TBA was reacted with 1,3-dibromobenzene to yield 1,3,5,7-tetrakis(meta-dibromophenyl)adamantane (TMDBPA) as generally described in *Macromolecules, 27*, 7015–7023 (1994) (supra).

Specifically, the Experimental Procedure for the above is as follows:

Equipment:
1. Dry 5 L 3-neck round bottom flask. 2. Water condenser. 3. Magnetic stir-bar. 4. Heating mantle. 5. Thermocouple. 6. Thermal controller unit. 7. N$_2$ inlet-outlet to 30% KOH solution. Assemble above equipment and Purge flask with N$_2$ for 10 min.

Procedure:
Weigh 160.00±0.30 g of TBA and 4,800.00±1.0 g of 1,3-dibromobenzene. Total volume is 3220 mL and d=1.49. Weigh 32.25±0.30 g of Aluminum Bromide. Pour 2 L (62% v/v from total volume) of 1,3-dibromobenzene into flask. Activate stir-bar.

Add full amount of TBA and rinse funnel with 1 L (31% v/v from total volume) of 1,3-dibromobenzene. Take HPLC sample of starting material. Compare with standard HPLC chromatogram.

Add full amount of aluminum bromide to solution and rinse funnel with 220 mL (7% v/v from total volume) of 1,3-dibromobenzene. Solution at this point should be dark purple with no precipitation visible. Stir the reaction mixture for 1 h at room temperature.

After 1 h, raise temperature of reaction mixture to 40° C. After temperature reaches 40° C., stir reaction mixture for 3 hr. Take HPLC sample at time 1+3.0, respectively, at 40° C. Note: The reaction is judged to be over if no traces of TBA are seen on HPLC chromatogram.

When reaction is over, pour the dark reaction mixture into a 20 L pail containing 7 L (217% v/v relative to the total volume of 1,3-dibromobenzene) D.I. Water, 2 L (62% v/v relative to the total volume of 1,3-dibromobenzene) ice, and 300 mL (37%) HCl (9% v/v relative to the total volume of 1,3-dibromobenzene). Stir vigorously using an overhead-stirrer for 1 hr±10 min.

Transfer the organic layer to a separatory chamber and wash it 2 times with 700 mL (22% v/v relative to the total volume of 1,3-dibromobenzene) portions of de-ionized water. Place the washed organic layer in a 4 L separatory funnel and add it, as a slow stream, to 16 L (5× times to the total volume of 1,3-dibromobenzene) methanol, in a 30 L pail placed under and overhead-stirrer, to precipitate a solid during 25 min±5 min.

After addition is complete, agitate the methanol suspension vigorously during 1 hr±10 min. Filter the methanol suspension by suction through a Buchner funnel (185 mm). Wash the solid on filter cake with three portions of 600 mL (19% v/v relative to the total volume of 1,3-dibromobenzene) methanol. Let the solid suction dry for 30 min.

Empty the pinkish powder into a crystallizer dish using a spatula and place it in a vacuum-oven to dry overnight. Weigh after drying. Re-dry in the vacuum-oven for 2 additional hours and re-weight. Continue drying, if necessary, until weight change is <1%. After solid is dry, record the final weight and calculate yield.

Unexpectedly, however, when the product mixture was subjected to fresh reagent and catalyst (1,3-dibromobenzene and AlCl$_3$, 1 min at 20° C.), TMDBPA was obtained in yields of approximately 75%.

A subsequent Experimental Procedure for converting the above product to a more useful product is as follows:

Equipment:
1. Dry 5 L 3-neck round bottom flask. 2. Water condenser. 3. Magnetic stir-bar. 4. Heating mantle. 5. Thermocouple. 6. Thermal controller unit. 7. N$_2$ inlet-outlet to 30% KOH solution. Assemble above equipment and Purge flask with N$_2$ for 10 min.

Procedure:
Calculate the corresponding amounts of 1,3-dibromobenzene and aluminum bromide needed based on the yield of the TMDBPA synthesized in the above/conventional synthesis.

Pour the appropriate amount (80% v/v from the total volume) of 1,3-dibromobenzene into flask. Activate stir-bar.

Add full amount of TMDBPA from the previous synthesis and rinse funnel with appropriate amount (10% v/v from the total volume) of 1,3-dibromobenzene.

Take HPLC sample of starting material. Compare with standard HPLC chromatogram.

Add full amount of aluminum bromide to the solution and rinse funnel with remainder (10% from the total volume) of 1,3-dibromobenzene. Solution at this point should be dark purple with no precipitation visible.

Stir the reaction mixture for 17 min at room temperature. Take HPLC sample after 5 min. Take HPLC sample after 17 min.

Note: The reaction is judged to be over when the group of peaks corresponding to TMDBPA is dominant in the HPLC chromatogram.

When reaction is over, pour the dark reaction mixture into a 20 L pail containing 7 L (217% v/v relative to the total volume of 1,3-dibromobenzene) D.I. Water, 2 L (62% v/v relative to the total volume of 1,3-dibromobenzene) ice, and 300 mL (37%) HCl (9% v/v relative to the total volume of 1,3-dibromobenzene).

Stir vigorously using an overhead-stirrer for 1 hr±10 min.

Transfer the organic layer to a separatory chamber and wash it 2 times with 700 mL (22% v/v to the total volume of 1,3-dibromobenzene) portions of D.I. water and 3 times with 700 mL (22% v/v relative to the total volume of 1,3-dibromobenzene) portions of saturated NaCl solution.

Place the washed organic layer in a 4 L separatory funnel and add it, as a slow stream, to the appropriate amount (5× times to the total volume of 1,3-dibromobenzene) methanol, in a 30 L pail placed under and overhead-stirrer, to precipitate a solid during 25 min±5 min.

After addition is complete, agitate the methanol suspension vigorously during 1 hr±10 min.

Filter the methanol suspension by suction through a Buchner funnel (185 mm).

Wash the solid on filter cake with three portions of 600 mL (19% v/v relative to the total amount of 1,3-dibromobenzene) methanol.

Let the solid suction dry for 30 min.

Empty the pinkish powder into a crystallizer dish using a spatula and place it in an oven to dry overnight. Weigh after drying. Re-dry in the vacuum-oven for 2 additional hours and re-weigh. Continue drying, if necessary, until weight change is <1%. After solid is dry, record the final weight and calculate yield.

Synthesis of 1,3,5,7-Tetrakis[meta-bis(phenylethynyl)phenyl]adamantane (TMBPEPA)

TMDBPA was reacted with phenylacetylene to yield the final product 1,3,5,7-tetrakis[(meta-bis(phenylethynyl)phenyl)]adamantane (TMBPEPA)—as a mixture of isomers—following a general reaction protocol for a palladium-catalyzed Heck ethynylation. TMBPEPA made from the reaction including TMDBPA is soluble in cyclohexanone. The yield is approximately 60%.

Specifically, the procedure for this step is as follows:
Equipment:
1. Dry 2 L 3-neck round bottom flask. 2. Water condenser. 3. Overhead-Stirrer. 4. Heating mantle. 5. Thermocouple. 6. Thermal controller unit. 7. Dropping funnel 8. 2-necked adapter. 9. $N_2$ inlet-outlet to 30% KOH solution. Assemble above equipment and Purge flask with $N_2$ for 10 min.
Procedure:
Weigh TMDBPA from second synthesis procedure from above.
Calculate amount needed for each of the following compounds: a) Phenylacetylene; b) $(Ph_3P)_2PdCl_2$; c) Triphenylphosphine; d) Copper(I) Iodide; and e) Triethylamine.
Add the appropriate amount of Triethylamine (Total volume from 1-e minus 300 mL) to the reaction flask and activate the overhead stirrer, follow it by the addition of the following compounds in the order listed below:
$(Ph_3P)_2PdCl_2$, rinse the funnel with 50 mL (4% of total volume) of triethylamine (TEA) and stir for 5 min.
Triphenylphosphine, rinse the funnel with 50 mL (4% of total volume) TEA, stir for 5 min.
Copper(I) Iodide, rinse the funnel with 50 mL (4% of total volume) TEA, stir for 5 min.

Add the total amount of TMDBPA from the second TMDBPA synthesis above and rinse the funnel with 100 mL (8% of total volume) TEA. Start heating the flask to 80° C.

Place the measured quantity of phenylacetylene diluted with 50 mL (4% of total volume) TEA in the dropping funnel, mounted on one neck of the 2-necked adapter.

Once the temperature of the reaction mixture reaches 80° C., take a sample for HPLC analysis. This material is the starting material.

Add the diluted phenylacetylene dropwise to the reaction mixture over 30 min±10 min.

Note: This is an exothermic reaction. Control the temperature by using a water bath.

Continue heating for 3 hours. The reaction is stopped after 3 hours of heating at 80° C. Take an HPLC sample at time 3 hours at 80° C.

Cool the reaction mixture to 50° C. then filter through a Buchner funnel. (185 mm). Wash the crude solids 2 times with 600 mL of TEA. (v/v %=52% relative to 1-e)

Load filter cake to a 4 L beaker and stir the contents with 1 L (v/v %=87% relative to 1-e) of TEA for 15 min at room temperature.

Filter through a Buchner funnel (185 mm) and wash the crude solids 2 times with 300 mL TEA. (v/v %=26% relative to 1-e)

Suction dry the solids overnight.

Note: Take 3 g of crude product for (TLC, HPLC, DSC, Trace Metals, UV-VIS) analysis.

Synthesis of 1,3,5,7-Tetrakis(para-dibromophenyl) adamantane (TPDBPA)

In a first step, TBA was reacted with 1,4-dibromobenzene to yield 1,3,5,7-tetrakis(para-dibromophenyl)adamantane (TPDBPA) as generally described in *Macromolecules*, 27, 7015–7023 (1994) (supra).

Specifically, the Experimental Procedure for the above is as follows:
Equipment:
1. Dry 5 L 3-neck round bottom flask. 2. Water condenser. 3. Magnetic stir-bar. 4. Heating mantle. 5. Thermocouple. 6. Thermal controller unit. 7. $N_2$ inlet-outlet to 30% KOH solution. Assemble above equipment and Purge flask with $N_2$ for 10 min.
Procedure:
Weigh 160.00±0.30 g of TBA and 4,800.00±1.0 g of 1,4-dibromobenzene. Total volume is 3220 mL and d=1.49. Weigh 32.25±0.30 g of Aluminum Bromide. Pour 2 L (62% v/v from total volume) of 1,4-dibromobenzene into flask. Activate stir-bar.

Add full amount of TBA and rinse funnel with 1 L (31% v/v from total volume) of 1,4-dibromobenzene. Take HPLC sample of starting material. Compare with standard HPLC chromatogram.

Add full amount of aluminum bromide to solution and rinse funnel with 220 mL (7% v/v from total volume) of 1,4-dibromobenzene. Solution at this point should be dark purple with no precipitation visible. Stir the reaction mixture for 1 h at room temperature.

After 1 h, raise temperature of reaction mixture to 40° C. After temperature reaches 40° C., stir reaction mixture for 3 hr. Take HPLC sample at time 1+3.0, respectively, at 40° C. Note: The reaction is judged to be over if no traces of TBA are seen on HPLC chromatogram.

When reaction is over, pour the dark reaction mixture into a 20 L pail containing 7 L (217% v/v relative to the total volume of 1,4-dibromobenzene) D.I. Water, 2 L (62% v/v relative to the total volume of 1,4-dibromobenzene) ice, and 300 mL (37%) HCl (9% v/v relative to the total volume of 1,4-dibromobenzene). Stir vigorously using an overhead-stirrer for 1 hr±10 min.

Transfer the organic layer to a separatory chamber and wash it 2 times with 700 mL (22% v/v relative to the total volume of 1,4-dibromobenzene) portions of de-ionized water. Place the washed organic layer in a 4 L separatory funnel and add it, as a slow stream, to 16 L (5× times to the total volume of 1,4-dibromobenzene) methanol, in a 30 L pail placed under and overhead-stirrer, to precipitate a solid during 25 min±5 min.

After addition is complete, agitate the methanol suspension vigorously during 1 hr±10 min. Filter the methanol suspension by suction through a Buchner funnel (185 mm). Wash the solid on filter cake with three portions of 600 mL (19% v/v relative to the total volume of 1,4-dibromobenzene) methanol. Let the solid suction dry for 30 min.

Empty the pinkish powder into a crystallizer dish using a spatula and place it in a vacuum-oven to dry overnight. Weigh after drying. Re-dry in the vacuum-oven for 2 additional hours and re-weight. Continue drying, if necessary, until weight change is <1%. After solid is dry, record the final weight and calculate yield.

Unexpectedly, however, when the product mixture was subjected to fresh reagent and catalyst (1,4-dibromobenzene and AlCl$_3$, 1 min at 20° C.), TPDBPA was obtained in yields of approximately 73%.

A subsequent Experimental Procedure for converting the above product to a more useful product is as follows:

Equipment:
1. Dry 5 L 3-neck round bottom flask. 2. Water condenser. 3. Magnetic stir-bar. 4. Heating mantle. 5. Thermocouple. 6. Thermal controller unit. 7. N$_2$ inlet-outlet to 30% KOH solution. Assemble above equipment and Purge flask with N$_2$ for 10 min.

Procedure:
Calculate the corresponding amounts of 1,4-dibromobenzene and aluminum bromide needed based on the yield of the TPDBPA synthesized in the above/conventional synthesis.

Pour the appropriate amount (80% v/v from the total volume) of 1,4-dibromobenzene into flask. Activate stir-bar.

Add full amount of TPDBPA from the previous synthesis and rinse funnel with appropriate amount (10% v/v from the total volume) of 1,4-dibromobenzene.

Take HPLC sample of starting material. Compare with standard HPLC chromatogram.

Add full amount of aluminum bromide to the solution and rinse funnel with remainder (10% from the total volume) of 1,4-dibromobenzene. Solution at this point should be dark purple with no precipitation visible.

Stir the reaction mixture for 17 min at room temperature. Take HPLC sample after 5 min. Take HPLC sample after 17 min.

Note: The reaction is judged to be over when the group of peaks corresponding to TPDBPA is dominant in the HPLC chromatogram.

When reaction is over, pour the dark reaction mixture into a 20 L pail containing 7 L (217% v/v relative to the total volume of 1,4-dibromobenzene) D.I. Water, 2 L (62% v/v relative to the total volume of 1,4-dibromobenzene) ice, and 300 mL (37%) HCl (9% v/v relative to the total volume of 1,4-dibromobenzene).

Stir vigorously using an overhead-stirrer for 1 hr±10 min.

Transfer the organic layer to a separatory chamber and wash it 2 times with 700 mL (22% v/v to the total volume of 1,4-dibromobenzene) portions of D.I. water and 3 times with 700 mL (22% v/v relative to the total volume of 1,4-dibromobenzene) portions of saturated NaCl solution.

Place the washed organic layer in a 4 L separatory funnel and add it, as a slow stream, to the appropriate amount (5× times to the total volume of 1,4-dibromobenzene) methanol, in a 30 L pail placed under and overhead-stirrer, to precipitate a solid during 25 min±5 min.

After addition is complete, agitate the methanol suspension vigorously during 1 hr±10 min.

Filter the methanol suspension by suction through a Buchner funnel (185 mm).

Wash the solid on filter cake with three portions of 600 mL (19% v/v relative to the total amount of 1,4-dibromobenzene) methanol.

Let the solid suction dry for 30 min.

Empty the pinkish powder into a crystallizer dish using a spatula and place it in an oven to dry overnight. Weigh after drying. Re-dry in the vacuum-oven for 2 additional hours and re-weigh. Continue drying, if necessary, until weight change is <1%. After solid is dry, record the final weight and calculate yield.

Synthesis of 1,3,5,7-Tetrakis[para-bis(phenylethynyl)phenyl]adamantane (TPBPEPA)

TpDBPA was reacted with phenylacetylene to yield the final product 1,3,5,7-tetrakis[(para-bis(phenylethynyl)phenyl]adamantane (TPBPEPA)—as a mixture of isomers—following a general reaction protocol for a palladium-catalyzed Heck ethynylation. TPBPEPA made from the reaction including TPDBPA is soluble in cyclohexanone. The yield is approximately 65%.

Specifically, the procedure for this step is as follows:

Equipment:
1. Dry 2 L 3-neck round bottom flask. 2. Water condenser. 3. Overhead-Stirrer. 4. Heating mantle. 5. Thermocouple. 6. Thermal controller unit. 7. Dropping funnel 8. 2-necked adapter. 9. N$_2$ inlet-outlet to 30% KOH solution. Assemble above equipment and Purge flask with N$_2$ for 10 min.

Procedure:
Weigh TPDBPA from second synthesis procedure from above.

Calculate amount needed for each of the following compounds: a) Phenylacetylene; b) (Ph$_3$P)$_2$PdCl$_2$; c) Triphenylphosphine; d) Copper(I) Iodide; and e) Triethylamine.

Add the appropriate amount of Triethylamine (Total volume from 1-e minus 300 mL) to the reaction flask and activate the overhead stirrer, follow it by the addition of the following compounds in the order listed below:

(Ph$_3$P)$_2$PdCl$_2$, rinse the funnel with 50 mL (4% of total volume) of triethylamine (TEA) and stir for 5 min.

Triphenylphosphine, rinse the funnel with 50 mL (4% of total volume) TEA, stir for 5 min.

Copper(I) Iodide, rinse the funnel with 50 mL (4% of total volume) TEA, stir for 5 min.

Add the total amount of TPDBPA from the second TPDBPA synthesis above and rinse the funnel with 100 mL (8% of total volume) TEA. Start heating the flask to 80° C.

Place the measured quantity of phenylacetylene diluted with 50 mL (4% of total volume) TEA in the dropping funnel, mounted on one neck of the 2-necked adapter.

Once the temperature of the reaction mixture reaches 80° C., take a sample for HPLC analysis. This material is the starting material.

Add the diluted phenylacetylene dropwise to the reaction mixture over 30 min±10 min.

Note: This is an exothermic reaction. Control the temperature by using a water bath.

Continue heating for 3 hours. The reaction is stopped after 3 hours of heating at 80° C. Take an HPLC sample at time 3 hours at 80° C.

Cool the reaction mixture to 50° C. then filter through a Buchner funnel. (185 mm). Wash the crude solids 2 times with 600 mL of TEA. (v/v %=52% relative to 1-e)

Load filter cake to a 4 L beaker and stir the contents with 1 L (v/v %=87% relative to 1-e) of TEA for 15 min at room temperature.

Filter through a Buchner funnel (185 mm) and wash the crude solids 2 times with 300 mL TEA. (v/v %=26% relative to 1-e)

Suction dry the solids overnight.

Note: Take 3 g of crude product for (TLC, HPLC, DSC, Trace Metals, UV-VIS) analysis.

Thus, specific embodiments and applications of compositions and methods to produce low dielectric constant polymeric networks with improved thermo-mechanical stability have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A polymeric network comprising:
a plurality of monomers, wherein at least one of the monomers comprises a cage compound having at least three arms, wherein at least one of the at least three arms has at least two branches, and wherein each of the at least two branches comprises a reactive group; and
wherein at least two of the monomers are covalently coupled to each other via the reactive group.

2. The polymeric network of claim 1 having a dielectric constant of no more than 3.0.

3. The polymeric network of claim 2 having a dielectric constant of between about 2.3 and 2.7.

4. The polymeric network of claim 1, wherein the cage compound comprises an adamantane or a diamantane.

5. The polymeric network of claim 1, wherein the cage compound has four arms, and wherein each of the four arms has two branches.

6. The polymeric network of claim 1, wherein each of the arms comprises a phenyl.

7. The polymeric network of claim 1, wherein the at least three arms have a total length L and wherein the polymeric network has a dielectric constant K, and wherein K decreases when L increases.

8. The polymeric network of claim 1, wherein the monomer comprises tetrakis[ortho-bis(phenylethynyl)phenyl] diamantane.

9. The polymeric network of claim 1, wherein the monomer comprises tetrakis[meta-bis(phenylethynyl)phenyl] diamantane.

10. The polymeric network of claim 1, wherein the monomer has a structure according to structure I:

Structure I

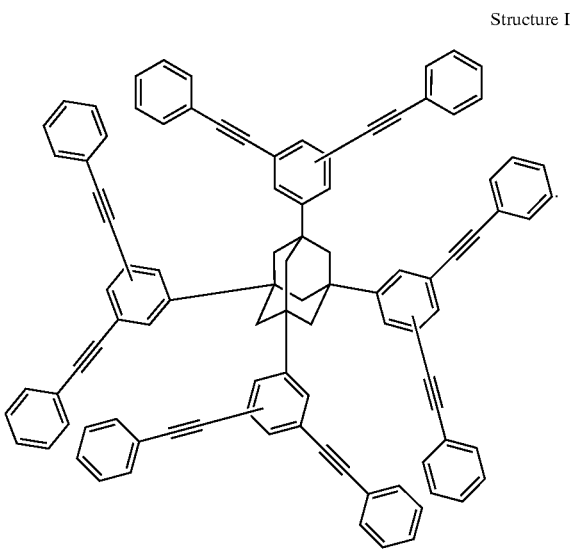

11. The polymeric network of claim 1, wherein the monomer has a structure according to structure II:

Structure II

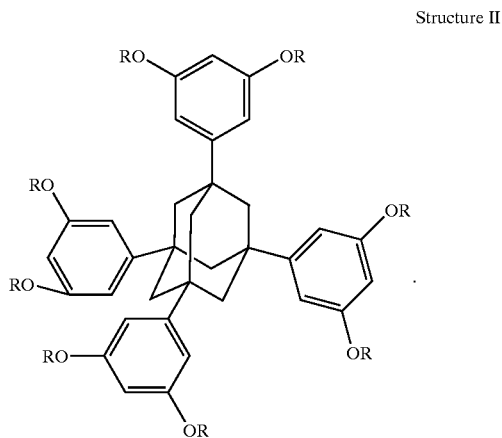

wherein R is selected from the group consisting of

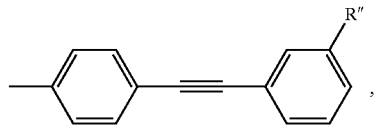

-continued

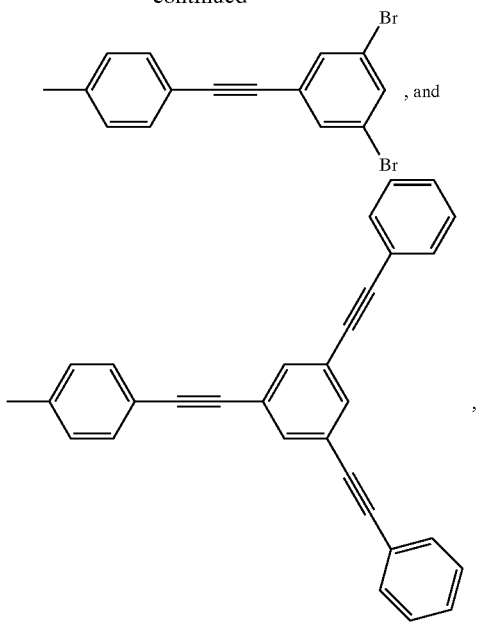

, and and wherein R" is H or OH.

12. The polymeric network of claim 1, wherein the reactive group comprises a triple bond.

13. The polymeric network of claim 1, wherein the covalent coupling between the at least two monomers occurs without addition of an exogenous crosslinker.

14. The polymer network of claim 1, wherein each of the monomers comprises a cage compound having at least three arms, wherein at least one of the at least three arms has at least two branches, and wherein each of the at least two branches comprises a reactive group.

15. A method of producing an electronic device, comprising:
providing a substrate having a surface; and
forming on the surface a polymeric network according to claim 1.

16. A method of producing an electronic device, comprising:
providing a substrate having a surface; and
applying to the surface a polymeric network according to claim 1.

17. The method of one of claims 15 or 16, further comprising curing the polymeric network.

18. The method of one of claims 15 or 16, wherein the cage compound comprises an adamantane or a diamantane, and wherein the at least three arms comprise a phenyl.

19. The method of one of claims 15 or 16, wherein the plurality of the monomers comprises a compound selected from the group consisting of tetrakis[ortho-bis(phenylethynyl)phenyl]diamantane, tetrakis[meta-bis(phenylethynyl)phenyl]diamantane, and tetrakis[meta-bis(phenylethynyl)phenyl]adamantane.

20. The method of one of claims 15 or 16, wherein the polymeric network has a dielectric constant of no more than 2.7.

21. The method of claim 15, wherein the step of forming the polymeric network further comprises dissolving the plurality of monomers in a solvent to form a spin-on solution, and applying the spin-on solution to the surface of the wafer.

22. The method of claim 15, wherein the covalent coupling of the at least two monomers via the reactive groups include thermal activation of the reactive groups.

23. A film comprising the polymeric network of claim 1.

24. An article comprising the polymeric network of claim 1.

25. An electronic component comprising the polymeric network of claim 1.

26. A compound comprising the polymeric network of claim 1.

27. A semiconductor component comprising the polymeric network of claim 1.

28. A layered material comprising the polymeric network of claim 1.

29. A layered component comprising the polymeric network of claim 1.

30. A layer comprising the polymeric network of claim 1.

31. The layer of claim 30, wherein the layer comprises a dielectric material.

32. The layer of claim 30, wherein the layer comprises a hardmask material.

33. The layer of claim 30, wherein the layer comprises an etchstop material.

34. The layer of claim 31, wherein the dielectric material comprises pores.

* * * * *